United States Patent [19]

Homma

[11] Patent Number: 5,199,628

[45] Date of Patent: Apr. 6, 1993

[54] WIRE BONDING DEVICE

[75] Inventor: Yasuaki Homma, Tokyo, Japan

[73] Assignee: NEC Corporation, Japan

[21] Appl. No.: 892,454

[22] Filed: Jun. 2, 1992

[30] Foreign Application Priority Data

Jun. 11, 1991 [JP] Japan .................................. 3-166395

[51] Int. Cl.$^5$ ........................ H01L 21/60; H05K 3/32
[52] U.S. Cl. ........................................ 228/4.5; 228/9
[58] Field of Search ................ 228/4.5, 9, 102, 179; 156/351, 360; 219/56.21

[56] References Cited

U.S. PATENT DOCUMENTS

| 3,941,486 | 3/1976 | Tyler | 228/9 |
| 4,109,846 | 8/1978 | Pennings et al. | 228/4.5 |
| 5,060,841 | 10/1991 | Oshima et al. | 228/102 |

FOREIGN PATENT DOCUMENTS 262348 10/1990 Japan ....................................... 228/9

Primary Examiner—Samuel M. Heinrich
Attorney, Agent, or Firm—Laff, Whitesel, Conte & Saret

[57] ABSTRACT

A wire bonding device which comprises a height detector that detects the surface height of a semiconductor pellet, a position detector that detects the two-dimensional position of the semiconductor pellet, and a bonding head controller that controls a bonding tool, which changes the search height for the bonding operation according to the surface height of the semiconductor pellet detected by the height detector, to thereby make the bonding load constant and stabilize the ahdesive strength of the wire in the wire bonding.

5 Claims, 3 Drawing Sheets

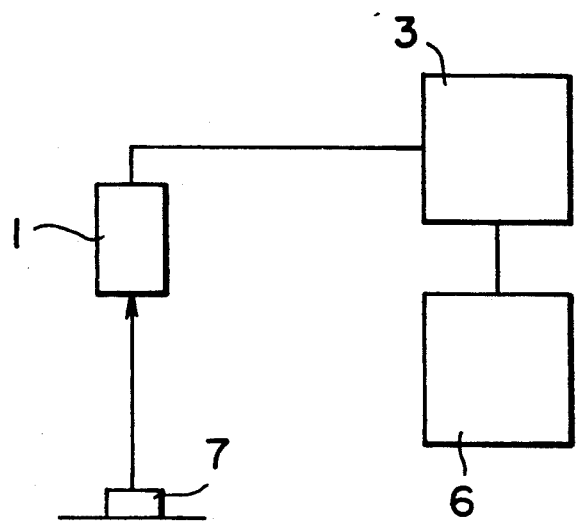
FIG. I
PRIOR ART
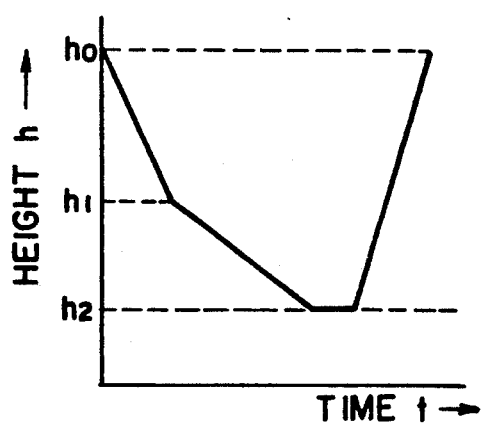
FIG. 2A
PRIOR ART
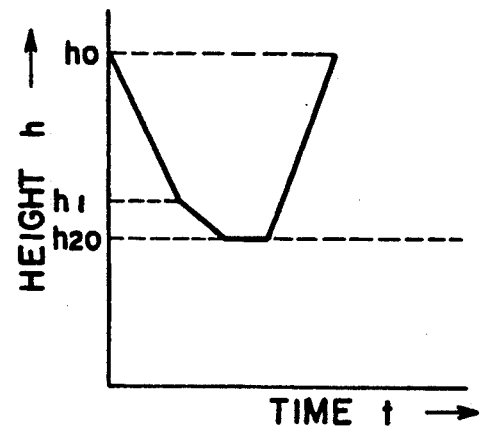
FIG. 2B
PRIOR ART

WIRE BONDING DEVICE

BACKGROUND OF THE INVENTION

1. Field of the Invention

This invention relates to a wire bonding device and in more particular to a wire bonding device which performs digital control of a bonding head.

2. Description of the Prior Art

As shown in FIG. 1, a prior wire bonding device is comprised of one television camera 1, a position detector 3, and a bonding head controller 6.

An image of the semiconductor pellet 7 is picked up using the television camera 1, and the video signal is input to the position detector 3. In the position detector 3, the positioning data for the semiconductor pellet 7 is calculated based on the input video signal, and the data is input to the bonding head controller 6. In the bonding head controller 6, the position of the bonding tool (not shown in the figure) is controlled based on the input positioning data for the semiconductor pellet 7, and metal wiring (not shown in the figure) is bonded to the semiconductor pellet 7. The variation over time of the end position of the bonding tool is shown in FIG. 2A. First, the bonding tool stops at an initial position $h_0$, and when the bonding operation begins it is rapidly lowered with time. Immediately after it reaches the height $h_1$, the lowering speed is decreased and it continues to be lowered toward the pellet position $h_2$. As soon as the bonding tool reaches the pellet position $h_2$ it stops and after a short wait it is raised in the direction of the initial height $h_0$.

The height $h_1$ where the speed changes during lowering of the bonding tool is called the search height. The speed is changed at this height because if the bonding tool strikes the semiconductor pellet 7 at high speed, cracks may occur in the semiconductor pellet 7 due to the impact, and so it is necessary to decrease the lowering speed of the bonding tool.

The pellet position $h_2$ is detected by a touch sensor (not shown in the figure) which is assembled in the bonding tool.

In the prior wire bonding device as mentioned above, an image of the semiconductor pellet is picked up using one television camera and the position of the semiconductor pellet is processed in the position detector using two-dimensional coordinates. The pellet position is detected using the touch sensor, and therefore, if the bonding operation is not actually performed, the height of the semiconductor pellet is unknown. If the height of the semiconductor pellet is changed from $h_2$ to $h_{20}$ as shown in FIG. 2B, the search height still remains fixed and so there are variations in the speed at which the bonding tool strikes the surface of the semiconductor pellet. This causes deformation in the end shape of the metal wiring (crushed too or short) and lowers the product quality, which is a problem.

SUMMARY OF THE INVENTION

An object of this invention is to provide a wire bonding device which takes great strides toward improving product quality.

According to this invention, the foregoing object can effectively be accomplished by providing a wire bonding device which comprises a height detector which detects the surface height of a semiconductor pellet without touching it, a position detector which detects the position of the semiconductor pellet, and a bonding head controller which controls a bonding tool based on the height data of the semiconductor pellet surface obtained from the height detector and based on the two-dimensional position coordinate data of the semiconductor pellet obtained from the position detector.

Also, the aforementioned height detector picks up an image of the semiconductor pellet from different angles and detects the surface height of the semiconductor pellet based on multiple images from these different angles of view.

In this invention, the search height during the bonding operation can be changed according to the surface height of the semiconductor pellet.

BRIEF DESCRIPTION OF THE DRAWINGS

The aforementioned and other objects, featured and advantages of this invention will become more apparent from the following description taken with reference to the accompanying drawing, wherein;

FIG. 1 is a diagram showing the construction of a wire bonding device of the prior art;

FIGS. 2A and 2B are diagrams showing the variation over time of the height of a bonding tool in an embodiment of a prior device;

DESCRIPTION OF THE PREFERRED EMBODIMENTS

Preferred embodiments of this invention will hereinafter be explained in detail with reference to the accompanying drawings.

Figure 3:
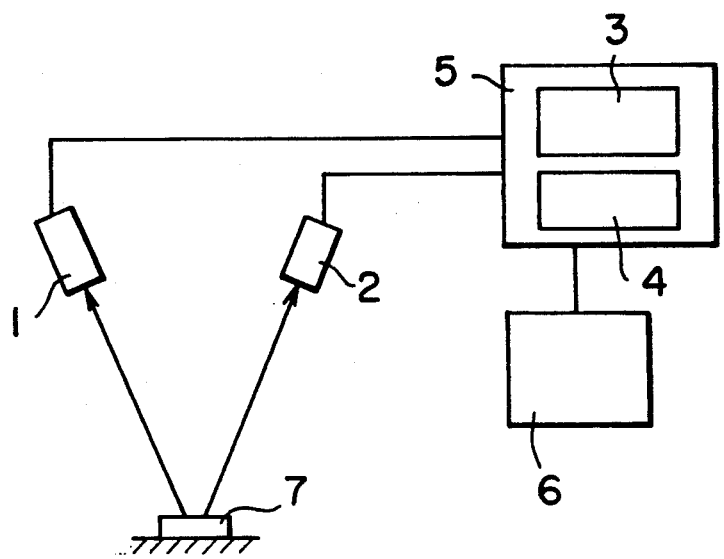
FIG. 3 is a diagram showing the construction of a wire bonding device of a first embodiment of this invention.

Referring to FIG. 3, there is shown a diagram showing the construction of a wire bonding device of a first embodiment of this invention.

In FIG. 3, there are two television cameras 1 and 2 located above a semiconductor pellet 7, with each camera pointed toward the semiconductor pellet 7 at a different angle. The two television cameras 1 and 2 are connected to an image processor 5. Inside the image processor 5 are a position detector 3 and a height detector 4. The image processor 5 is connected to a bonding head controller 6.

The two television cameras 1 and 2 both pick up an image of the semiconductor pellet 7 from different angles and so the images produced by the television cameras are from different angles of view. These two images from the different view angles are analyzed in the height detector 4 in the image processor 5 and the surface height of the semiconductor pellet 7 is found. In the position detector 3, two-dimensional position coordinates of the semiconductor pellet 7 are found by analyzing one of the images from either television camera 1 or 2. The obtained surface height of the semiconductor pellet 7 and the two-dimensional position coordinates are input to the bonding head controller 6 and the bonding head controller 6 controls a bonding tool based on this data.

Figure 4A:
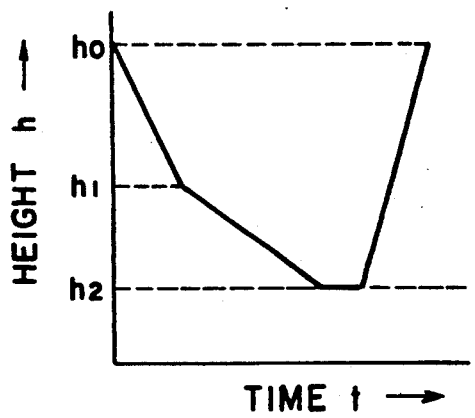
FIGS. 4A and 4B are diagrams showing the variation over time of the height of a bonding tool in an embodiment of this invention.
Figure 4B:
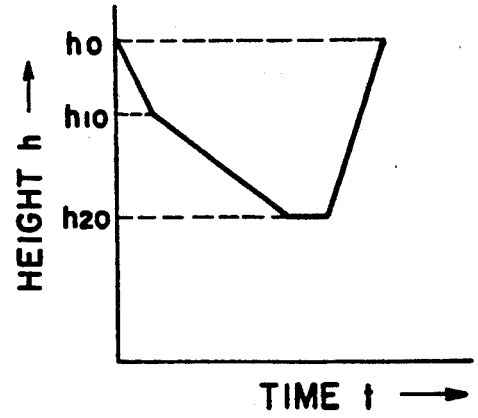

Referring to FIG. 4A, there is shown the variation over time of the bonding tool height controlled by the bonding head controller 6. For certain conditions the semiconductor pellet height is taken to be $h_2$, and the search height is taken to be $h_1$. When the semiconductor pellet height is changed from $h_2$ to $h_{20}$ as shown in FIG. 4B, the data for semiconductor pellet height $h_{20}$ is input to the bonding head controller 6 from the image processor 5, and the search height is changed from $h_1$ to $h_{10}$ so that the difference between the search height and the semiconductor pellet height remains constant. The bonding head controller 6 then performs the bonding operation by controlling the bonding tool.

Figure 5:
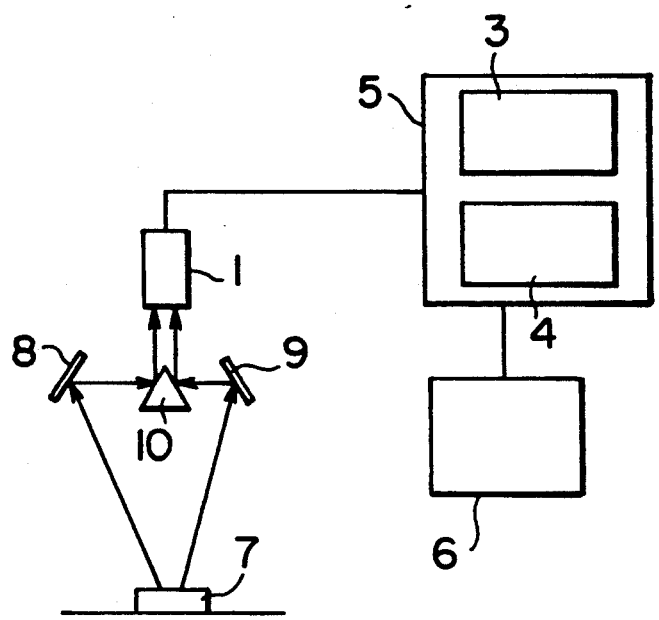
FIG. 5 is a diagram showing the construction of a wire bonding device of a second embodiment of this invention.
Figure 6:
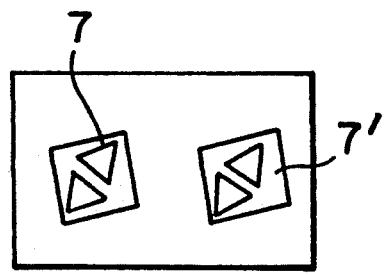
FIG. 6 is a diagram showing the television camera images of the second embodiment shown in FIG. 5.

Referring to FIG. 5, there is shown a diagram showing the construction of a wire bonding device of a second embodiment of this invention. In this embodiment, there is a prism 10 below the television camera 1 and there are mirrors 8 and 9 located on the left and right of the prism 10. The television camera 1 simultaneously picks up two images from different angles on the left and right of the semiconductor pellet 7 from the prism 10 and the mirrors 8 and 9. These images (7 and 7') are shown in FIG. 6. From these images, the two-dimensional position coordinates of the semiconductor pellet 7 are obtained from the position detector 3 in the image processor 5, and the surface height of the semiconductor pellet 7 is detected by the height detector 4. This data is then output to the bonding head controller 6. The bonding head controller 6 then performs the bonding operation by changing the search height according to the surface height of the semiconductor pellet 7 in the same manner as was done in the first embodiment. The second embodiment has the advantage that only one expensive television camera needs to be used, and since two images can be obtained on one screen of different view angles, the construction of the image processor is simplified making it possible to lower the device cost.

The second embodiment describes the case when two optical axes are used, however, it is the same in the case where a single axis or multiple axes are used.

This invention as described above, is equipped with a height detector for detecting the surface height of the semiconductor pellet without touching it, a position detector which detects the position of the semiconductor pellet, and a bonding head controller which controls the bonding tool, and so the search height can be changed according to the surface height of the semiconductor pellet and the speed at which the bonding tool reaches the surface of the semiconductor pellet can be made constant and the end shape of the metal wiring is constant thus remarkedly improving the product quality.

What is claimed is:

1. A wire bonding device which comprises a height detector which detects the surface height of a semiconductor pellet without touching it; a position detector which detects the position of said semiconductor pellet; and a bonding head controller which controls a bonding tool based on the surface height data of said semiconductor pellet obtained from said height detector and the two-dimensional position coordinate data of said semiconductor pellet obtained from said position detector.

2. The wire bonding device of claim 1 in which said height detector detects the surface height of said semiconductor pellet based on multiple images from different view angles picked up from different angles of said semiconductor pellet.

3. The wire bonding device of claim 2 in which said multiple images from different view angles are two images from different view angles.

4. The wire bonding device of claim 3 in which said two images from different view angles are obtained by picking up an image of the semiconductor pellet with two television cameras located above said semiconductor pellet, with each camera pointed toward said semiconductor pellet at a different angle, said television cameras being connected to the height detector and the position detector.

5. The wire bonding device of claim 3 in which said two images from different view angles are obtained by picking up an image of the semiconductor pellet with one television camera from a prism below said television camera and mirrors located on the left and right of said prism, said television camera being connected to the height detector and the position detector.

* * * * *